United States Patent
Biber

(10) Patent No.: US 10,681,850 B2
(45) Date of Patent: Jun. 9, 2020

(54) MAGNETIC RESONANCE APPARATUS WITH A COOLING DEVICE, AND METHOD FOR PRODUCING SUCH A MAGNETIC RESONANCE APPARATUS

(71) Applicant: Siemens Healthcare GmbH, Erlangen (DE)

(72) Inventor: Stephan Biber, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/286,729

(22) Filed: Feb. 27, 2019

(65) Prior Publication Data

US 2019/0269030 A1     Aug. 29, 2019

(30) Foreign Application Priority Data

Feb. 27, 2018 (EP) .................................. 18158887

(51) Int. Cl.
*H05K 7/20* (2006.01)
*G01R 33/3815* (2006.01)
*H01F 6/00* (2006.01)

(52) U.S. Cl.
CPC ......... *H05K 7/209* (2013.01); *G01R 33/3815* (2013.01); *H01F 6/006* (2013.01); *H05K 7/20254* (2013.01); *H05K 7/20927* (2013.01)

(58) Field of Classification Search
None
See application file for complete search history.

(56) References Cited

U.S. PATENT DOCUMENTS

| | | | | |
|---|---|---|---|---|
| 5,394,129 A | * | 2/1995 | Obasih | H01F 6/006 174/15.4 |
| 9,746,533 B2 | * | 8/2017 | Overweg | H01F 6/008 |
| 9,991,437 B2 | * | 6/2018 | Brice | H01F 6/065 |
| 10,082,549 B2 | * | 9/2018 | Lvovsky | H01F 6/04 |
| 10,107,880 B2 | * | 10/2018 | Aley | H01F 6/003 |
| 2008/0115510 A1 | * | 5/2008 | Crowley | F25B 9/145 62/51.1 |

(Continued)

FOREIGN PATENT DOCUMENTS

| | | |
|---|---|---|
| CN | 204305549 U | 4/2015 |
| DE | 19527150 A1 | 1/1997 |
| DE | 102016208107 A1 | 11/2017 |

OTHER PUBLICATIONS

European Search Report dated Aug. 30, 2018, for application No. EP 18 15 8887.

*Primary Examiner* — Courtney L Smith
(74) *Attorney, Agent, or Firm* — Schiff Hardin LLP

(57) ABSTRACT

A magnetic resonance (MR) apparatus has an MR scanner with a basic field magnet formed by a superconducting coil so as to generate a basic magnetic field, a ramp device for ramping down and/or ramping up the basic field magnet, with a ramp component arranged on the MR scanner emitting heat in the ramp-up process and/or a ramp-down process, and a cooling device and at least one electronic unit to be cooled. The cooling device has a cooling plate that, with respect to the MR scanner, is in outward heat-conducting contact with the ramp component. Outwardly adjoining the cooling plate in heat-conducting contact is a carrier plate, which carries at least one electronic unit in heat-conducting contact.

14 Claims, 3 Drawing Sheets

(56) References Cited

U.S. PATENT DOCUMENTS

| | | | |
|---|---|---|---|
| 2009/0275014 A1* | 11/2009 | Maltezos | B01L 3/50851 |
| | | | 435/5 |
| 2014/0028316 A1* | 1/2014 | Mine | G01R 33/3815 |
| | | | 324/318 |
| 2015/0062819 A1 | 3/2015 | Oughton, Jr. et al. | |
| 2015/0255977 A1* | 9/2015 | Jonas | G01R 33/3815 |
| | | | 361/19 |
| 2017/0328969 A1* | 11/2017 | Biber | G01R 33/546 |
| 2019/0178963 A1* | 6/2019 | Poole | G01R 33/3852 |

* cited by examiner

MAGNETIC RESONANCE APPARATUS WITH A COOLING DEVICE, AND METHOD FOR PRODUCING SUCH A MAGNETIC RESONANCE APPARATUS

BACKGROUND OF THE INVENTION

Field of the Invention

The invention concerns a magnetic resonance (MR) apparatus of the type having an MR scanner with a basic field magnet with a superconducting coil that generates a basic magnetic field, a ramp device designed for ramping down and/or ramping up the superconductivity of the basic field magnet, with a ramp component arranged on the basic field magnet that emits heat in a ramp-up procedure and/or a ramp-down procedure, in particular a power supply for the basic field magnet and/or a ramp down load unit with an electrical load used on ramping down, a cooling device, and at least one electronic unit to be cooled. The invention also concerns a method for producing a magnetic resonance apparatus of this type.

Description of the Prior Art

Magnetic resonance apparatuses are often used in the clinical field for diagnostic medical imaging and elsewhere for materials testing. In the process of generating MR data, a basic magnetic field is produced by a basic field magnet that is installed in a (usually) cylindrical basic magnet of the MR scanner and has a superconducting coil. For cooling the superconductor of the coil, a magnet of this type usually also has a cooling system that is operated with a coolant, such as helium.

However, other components of the magnetic resonance apparatus also require cooling, in particular electronic units, which can have power electronic components, for example in the form of power amplifiers. The RF transmitter, RF receiver, and the sequence controller are examples. The corresponding cooling devices, which often use water as the coolant, are usually designed to be less effective in currently known magnetic resonance apparatuses, because the cooling capacity is distributed over long distances and is often advanced to the components to be cooled with low efficiency.

It is therefore known, for example, for the RF transmitter and the RF receiver of the MR scanner to use water cooling. For the RF transmitter, final stages thereof are water cooled directly, while for the RF receiver and its electronic components, and the small signal electronic components of the RF transmitter, it is known to generate cold water in an air-water heat exchanger. The cold water is then force-circulated, for example using ventilators, in corresponding housings containing the electronic components. The infrastructure costs and the space requirement associated therewith are extremely high.

In other embodiments in the prior art it is known to provide electronic units directly with a separate cooler, which is then part of the corresponding electronics module. The costs are increased, because a more complex installation and overheads occur due to all of the logistics chains. A further drawback is that cooling with such coolers is possible only for an individual module or electronic unit.

These problems are even more acute in newer magnetic resonance apparatuses, in particular those that use only a small amount of helium as the coolant of the cooling system of the basic field magnet, for example less than 10 liters. This is because a ramp device is used that in turn uses the power supply of the magnetic resonance apparatus to supply the power for the basic field magnet, and this ramp device is designed to ramp up and ramp down the basic field magnet (thus the current flow in the superconducting coil). Therefore, for a service procedure or when re-start of the basic field magnet on site is necessary, procedures that are easy to implement are used in order to be able to quickly ramp down the basic field magnet and ramp it up again. For ramping down the basic field magnet, a load, known as the ramp down load, is necessary, which can be provided in a ramp down load unit. For example, DE 10 2016 081 107 A1 discloses a magnetic resonance apparatus having a power supply of this type, which is mounted on the scanner itself, and can be controlled to ramp down the current through the superconducting coil of the basic field magnet.

There is thus also the need to cool the ramp down load and the power supply of the MR scanner in apparatuses of this type. High cooling demands occur with respect to the ramp down load because powers of up to 3 kW, for example, can be implemented therewith.

SUMMARY OF THE INVENTION

An object of the invention is therefore to provide an efficient implementation of a cooling device for components of a magnetic resonance apparatus that are located outside of the MR scanner, and that is simplified compared to the prior art, and that also allows simplified production (manufacture or assembly) of the magnetic resonance apparatus.

This object is achieved by a magnetic resonance apparatus of the type initially described wherein, according to the invention, the cooling device has a cooling plate which, with respect to the MR scanner, is in outward heat-conducting contact with the ramp component and, outwardly adjoining this cooling plate in heat-conducting contact, is a carrier plate that carries (supports) at least one electronic unit in heat-conducting contact therewith.

This means that the cooling plate is designed both for cooling of the ramp component, in particular the ramp down load unit, as well as for indirect cooling of the at least one electronic unit, since the carrier plate acts not only as a carrying component for the at least one electronic unit, but also acts as a heat exchanger from the electronic unit to the cooling plate, or as a cooling distributor to the electronic unit (or multiple electronic units). The ramp component that is permanently installed on the MR scanner is provided with a cooling plate, which is (preferably) cooled by a coolant circulating in the cooling device, in particular coolant flowing therethrough. Water is preferably used as the coolant. For example, the cooling plate can have cooling channels connected to a corresponding coolant circuit, which channels allow a sufficiently high cooling capacity to be supplied for the case of ramping up or ramping down of the current flow in the superconducting coil of the basic field magnet, since when significant heating of the ramp component (which can be a power supply and/or ramp down load), occurs, the ramp component is thermally coupled to the cooling plate. The cooling plate is preferably mounted directly on the ramp component by a thermally conductive adhesive and/or mechanical mount. As noted, the ramp device can be an appropriately designed power supply of the magnetic resonance apparatus.

Many electronic units that require cooling have to be mounted on the MR scanner anyway, so the present invention makes use of a shared carrier plate for these electronic units, and this reduces the number of mechanical interfaces, for example, weld seams on the MR scanner, reduces costs, and also allows prefabrication of the carrier plate with the one or more electronic units.

The carrier plate is thermally connected to the cooling plate of the ramp component, wherein the carrier plate, in particular for carrying multiple electronic units, can be designed to be much larger than the cooling plate.

The carrier plate can be mounted on the (cylindrical) MR scanner by mounting brackets. In a preferred embodiment of the present invention, however, alternatively or additionally, the cooling plate carries the carrier plate mounted thereon that has the at least one electronic unit. This means, beyond the thermal connection of the carrier plate to the cooling plate, a mechanical connection can also be provided between the carrier plate and the cooling plate, for example by using a thermally conductive adhesive and/or mechanical mount, for example using screws or the like. The electronic units are then preferably arranged on the side of the carrier plate remote from the cooling plate, so the carrier plate, as described, can fulfil two functions simultaneously, namely as a carrier part for simplifying assembly and at the same time can act as a distributor of cooling capacity. If the cooling plate is mounted on the ramp component, in particular the ramp down load unit, the weight can be diverted across it, and this allows the cooling components and the electronic units to be mounted without any further assembly points on the MR scanner.

While the components discussed herein can be arranged on one side of the MR scanner, with a cylindrical design on the cylindrical surface thereof, it is preferred for at least the ramp component, optionally carrying the cooling plate, the carrier plate and the electronic units, but in particular also the cooling plate and/or the carrier plate, to be mounted on one end, in particular the end face, of the elongate, substantially cylindrical MR scanner. With an elongate, cylindrical design of the MR scanner, in particular with a cylindrical patient aperture, mounting on the end faces of the vacuum vessel, in which the basic field magnet is arranged, is recommended. The vacuum vessel is usually constructed such that the end faces are designed to absorb the strong vertical forces of the gradient coil arrangement anyway, meaning that the further components are of no consequence. The sides of the vacuum vessel, formed substantially as a surface of a cylinder, then only have to withstand the vacuum.

With the less preferred attachment on a curved lateral surface of the MR scanner, the carrier plate can be designed to follow the shape of the lateral surface, and can therefore be molded on the MR scanner. A bent design is also conceivable for such molding.

The carrier plate therefore allows a large part of the thermal output of the electronics to be dissipated without ventilators or other complex components being required, or electronic components potentially becoming too hot with passive cooling. It should be noted that with a ramp down load unit as the ramp component, the cooling capacity that the cooling plate must accommodate, is primarily determined by the ramp down load. If the ramp down load is used, other electronic units, for example the RF transmitter and the like, are inactive, meaning that the required cooling capacities are not summed. While cooling capacities of, for example, up to 3 kW can be needed for the ramp down load unit, different types of electronic units of the magnetic resonance device usually require only 20 to 200 W, so losses in cooling capacity due to the thermal conduction of the carrier plate are less relevant, since the existing cooling capacity has to be configured to be much higher anyway than that required by the at least one electronic unit. A similar consideration applies to the power supply unit (which can also be called a ramp up unit) as the ramp component. The power supply unit can be a power pack.

It should be noted that the carrier plate is designed to be large, therefore larger than the cooling plate, is also capable of cooling hot air that potentially accumulates under the outer cover (shell) of the MR scanner. This generation of hot air can occur, for example, if electronic components of the at least one electronic unit do not dissipate all of their heat via the carrier plate.

To summarize, the invention makes double use of a carrier plate: firstly for mechanical retention of at least one electronic unit, and secondly for conducting cooling capacity to the electronic components. The carrier plate may be in thermal contact of multiple electronic units, and acts as a distributor of the cooling capacity for electronic components of this kind having a wide variety of functions. This results in simplified manufacture with respect to the cooling device and the electronic units that are to be mounted on the MR scanner. Using the cooling plate for the ramp component as well makes efficient cooling possible without significant additional expenditure (no separate cooling for individual electronic units) and without components that require maintenance, such as ventilators. In this context it was recognized that the ramp component and the electronic components do not require simultaneous maximum cooling, enabling the multiple uses of the cooling plate.

It should also be noted that a number of carrier plates can be used, which are connected in an appropriately heat-conducting manner to the cooling plate. However, the use of a single carrier plate is preferred. The carrier plate is preferably made of aluminum, since this material allows adequate heat conductivity with a design of the carrier plate that is lighter as a whole. Other materials are also conceivable for the carrier plate, for example with desired improved heat conductivity such as copper.

In an embodiment of the present invention, the carrier plate has at least one heat-conducting structure, in particular a thickness variation and/or at least one cooling rib. Heat-conducting structures of this kind, which are basically known in the prior art, especially a variation in the thickness and/or use of ribs, so as to allow targeted conduction of heat and therewith of the cooling capacity inside the carrier plate. Therefore, in another embodiment the at least one heat-conducting structure defines a heat conduction path from at least one of the at least one electronic units to the cooling plate. In this way unnecessary cooling at locations remote from electronic units can be largely avoided. This results in another embodiment in this context wherein heat-conducting paths, at least some of which have different heat conductivity for different electronic units, are provided in the carrier plate, in particular as a function of their cooling demand. This means heat-conducting paths with lower heat conductivity can be directed to electronic units having a lower cooling demand, while heat-conducting paths with greater heat conductivity can be directed to electronic units having a greater cooling demand, in order to ensure adequate cooling of all electronic units. The efficiency of the cooling is improved further as a whole in this way.

In this context it can also be expedient for a cooling control unit that controls the cooling device to be designed for supplying a relatively high cooling capacity to the cooling plate during ramping down and/or ramping up of the basic field magnet. As has already been mentioned, particularly high cooling capacities are required when the ramp down load of the ramp down load unit heats up owing to ramping down of the current flow inside the superconducting coil. Therefore, if corresponding control components, for example pumps, are present, the cooling capacity can be adjusted to a current situation and a current cooling demand of the components to be cooled of the magnetic resonance device. The same thing applies to ramping up, with the power supply unit as the ramp component.

In addition to the magnetic resonance apparatus, the invention also concerns a method for manufacturing a magnetic resonance apparatus according to the invention that includes the following steps.

At a first location in the production process, the ramp component, in particular the ramp down load unit, is attached to the MR scanner.

At a second location in the production process, the cooling plate is attached in heat-conducting contact with the ramp component, in particular to the ramp component, and the carrier plate is attached in heat-conducting contact with the cooling plate, in particular to the cooling plate, and the at least one electronic unit is attached in heat-conducting contact to the carrier plate.

As mentioned, the design of the inventive magnetic resonance device offers particular advantages when producing the magnetic resonance apparatus since, particularly when the mechanical connections from the MR scanner occur directly in the sequence: main magnetic unit—ramp component, ramp component—cooling plate, cooling plate—carrier plate, carrier plate—electronic unit, only the ramp component itself heads to be mounted directly on the MR scanner. As provided in the inventive method, the main magnetic unit is produced with the ramp component, in particular ramp down load unit, already attached, and is then supplied at a second place of production. This achieves particularly straightforward attachment and maintenance of the outwardly following components outside of the production of the MR scanner.

In an embodiment of the inventive method, the second location of the production process, the at least one electronic unit is first attached in heat-conducting contact to the carrier plate, so that a prefabricated unit results, which can then be attached, as a whole, to the cooling plate. This constitutes a further, significant simplification in the production process since the electronic units can even be assembled remotely from the MR scanner in a prefabrication step.

DESCRIPTION OF THE PREFERRED EMBODIMENTS

Figure 1:
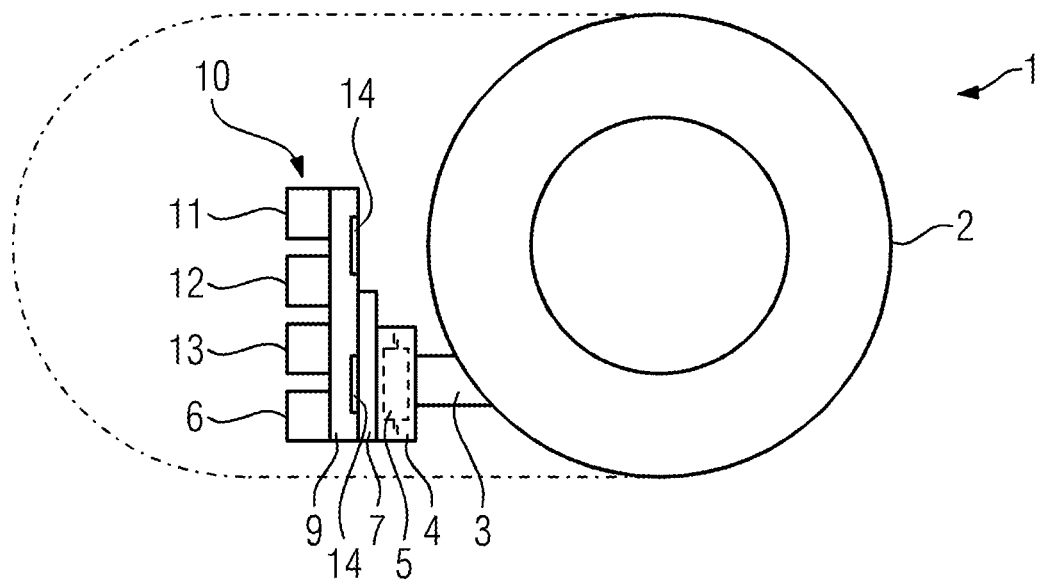
FIG. 1 is a cross-section of an inventive magnetic resonance apparatus, illustrating components relevant to the present invention.

FIG. 1 shows a fundamental cross-sectional view of an exemplary embodiment of an inventive magnetic resonance (MR) apparatus 1. This has a substantially cylindrical MR scanner 2 having a superconducting coil as the basic field magnet, and a cooling system for the superconducting coil. For simplicity, these components are not shown in detail. The amount of helium required and therefore provided in the cooling system of the MR scanner 2 is less than 10 liters in the present case.

Mounted on the outside of the MR scanner 2 by a mount 3, for example mounting brackets, is a ramp down load unit 4 as the ramp component, which may include a ramp down load 5. The ramp down load 5 is used when the current flow in the superconducting coil is to be ramped down, for which ramping down of the basic field magnet of an appropriately designed power supply unit 6 is required for the superconducting coil. A large amount of heat is produced in this process, which has to be dissipated by an appropriate cooling capacity of a cooling device of the magnetic resonance apparatus 1. This cooling device is formed in accordance with the invention by a cooling plate 7, which is not only in thermal contact with the ramp down load unit 4, but is also mounted thereon, so as to be carried by it. The cooling plate 7 has cooling channels, (not shown for clarity) for a coolant, in this case water, which can be supplied via coolant lines 8 indicated in FIG. 2 and that circulates in a coolant circuit of the cooling device.

A carrier plate 9 is mounted outwardly on the cooling plate 7, in other words on the side remote from the MR scanner 2, the carrier plate 9 also being in heat-conducting contact with the cooling plate 7, for example by using a heat-conducting adhesive and/or another heat-conducting material. The carrier plate 9 is designed to be much larger than the cooling plate 7 and in the present case is made of aluminum.

In addition to the power supply unit 6, further electronic units 10 of the magnetic resonance apparatus 1, in the present case an RF transmitter 11, an RF receiver 12 and a sequence controller 13, which have to be cooled, are in turn also attached to the carrier plate 9 so as to be in heat-conducting contact.

The cooling plate 9 can have structures 14, in particular ribs and/or variations in thickness, that are schematically shown in FIG. 1, in order to define heat-conducting paths from the electronic units 10 to the cooling plate 7, which can have a different heat conductivity as a function of the cooling demand of the respective electronic unit 10.

In this way the carrier plate 9 acts not only as a carrier part for the electronic units 10, so mechanical connections to the MR scanner 2 are avoided, but also as a heat distributor or cooling capacity distributor for the electronic units 10. Since the cooling plate 7 is in any case dimensioned for the large quantities of heat of the ramp down unit that occur, there are still adequately high cooling capacities on the electronic units 10, despite the interconnection of the carrier plate 9.

The cooling device can, moreover, have a cooling control unit (not individually shown for clarity, but that can be implemented as a further electronic unit 10), which controls the cooling capacity supplied by the cooling plate 7.

Figure 3:
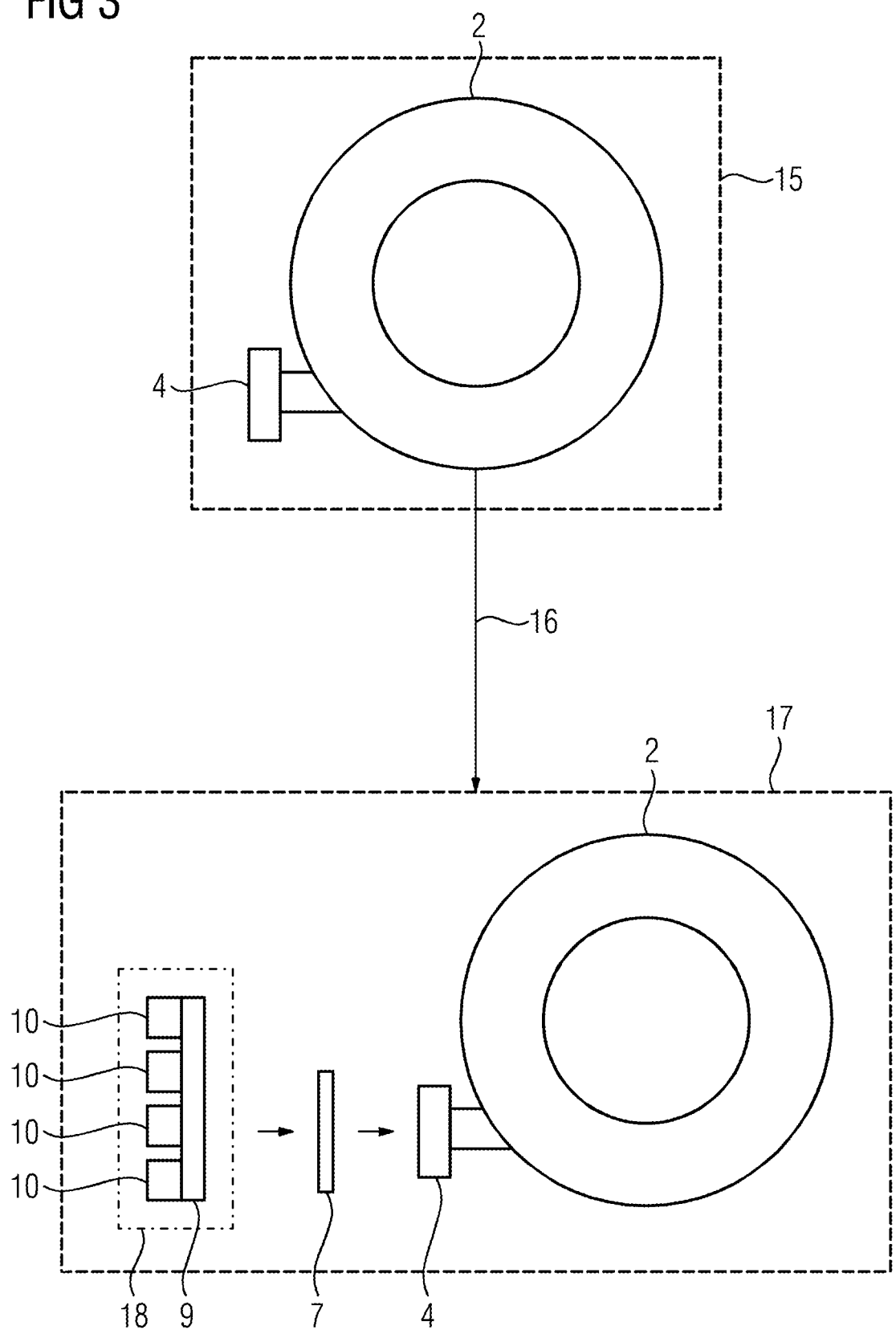
FIG. 3 is a flowchart for producing the inventive magnetic resonance apparatus.

FIG. 3 illustrates an inventive production method for a magnetic resonance apparatus 1 of this kind. The MR scanner 2 with ramp down load unit 4 mounted thereon is produced at a first location 15 of the production process, and is delivered to a second location 17 of the production process according to the arrow 16. There, the cooling plate 7 is first mounted on the ramp down load unit 4, after which an already prefabricated assembly of the carrier plate 9 and the electronic units 10 is mounted on the cooling plate 7. Prefabrication also takes place in particular at the second location 17, as is indicated by the outline 18.

The carrier plate 9 can be molded to the course of the lateral surface of the MR scanner 2, for example, be curved and/or bent.

Figure 2:
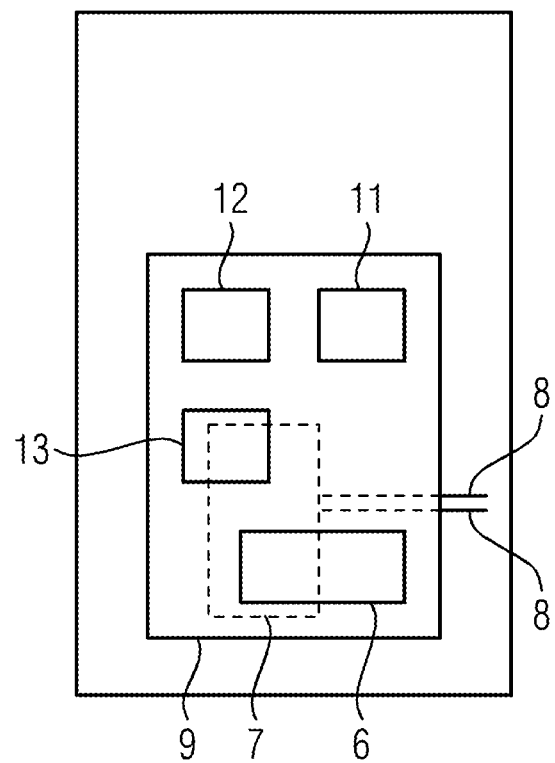
FIG. 2 is a lateral top view of an inventive magnetic resonance apparatus, illustrating components relevant to the present invention.
Figure 4:
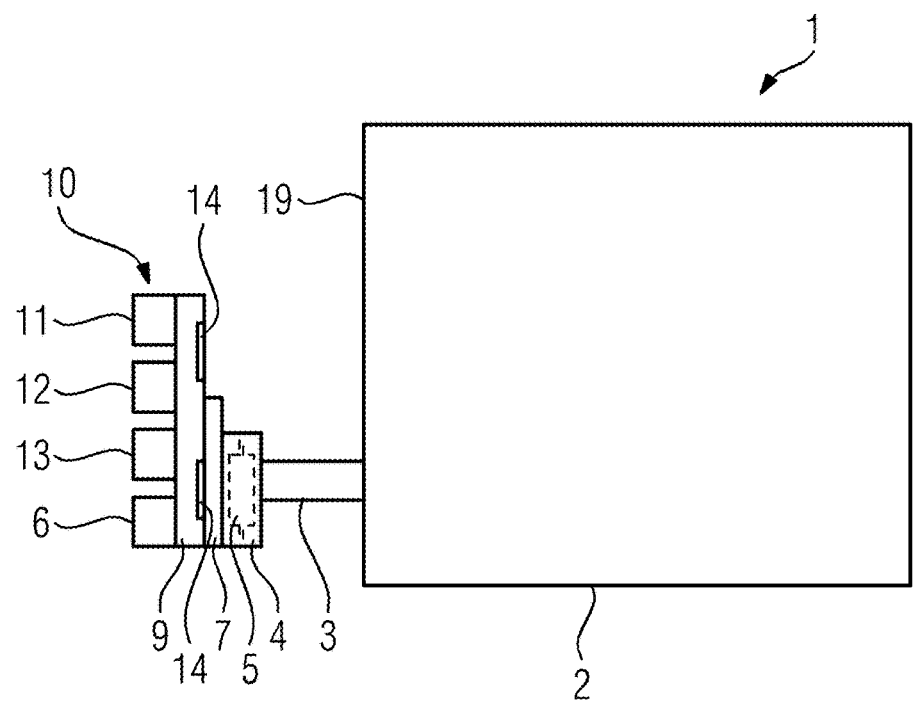
FIG. 4 is a cross-section corresponding to FIG. 1 for a second exemplary embodiment of the inventive magnetic resonance apparatus.
Figure 5:
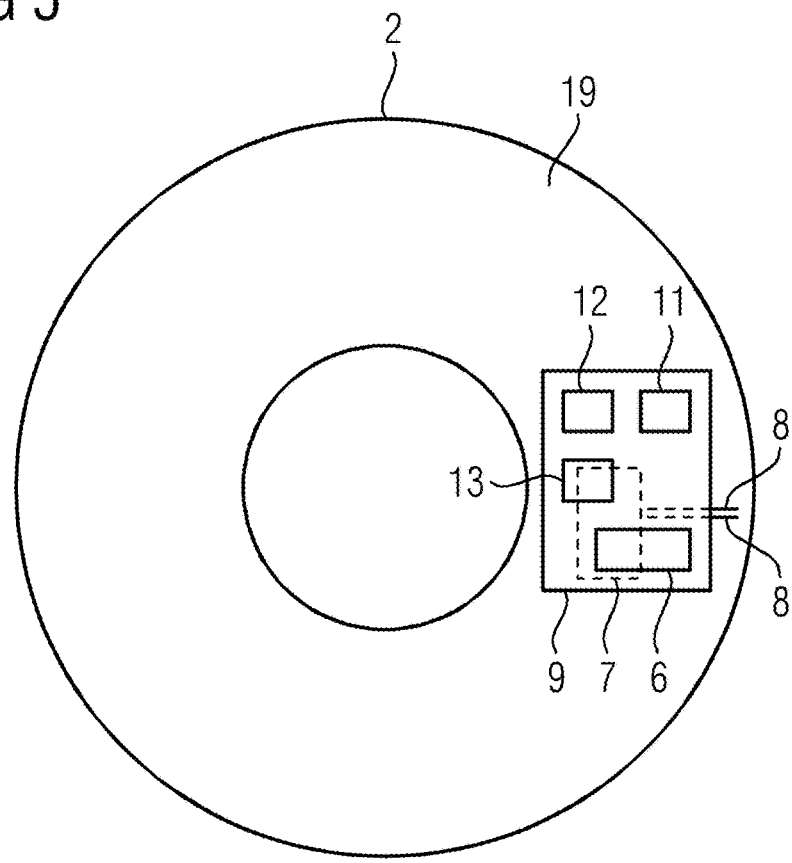
FIG. 5 is an end face top view of the second exemplary embodiment corresponding to FIG. 2.

In a second exemplary embodiment of the invention shown in FIG. 4 and FIG. 5 corresponding to FIG. 1 and FIG. 2, in a preferred embodiment the ramp component, here again the ramp down load unit 4, is mounted on an end face 19 of the elongate MR scanner 2, which, as in the first exemplary embodiment, is substantially cylindrical.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A magnetic resonance (MR) apparatus comprising:
   an MR scanner comprising a basic field magnet formed by a superconducting coil, to generate a basic magnetic field;
   a ramp device configured to operate for at least one of ramping down and ramping up the basic field magnet, said ramp device comprising a ramp component situated on the MR scanner that emits heat during a ramping up or ramping down procedure;
   a cooling device; and
   at least one electronic unit that is cooled by said cooling device,
   wherein said cooling device comprises a cooling plate that, with respect to the MR scanner, is in outward heat-conducting contact with said ramp component, and a carrier plate that outwardly adjoins said cooling plate in heat-conducting contact therewith, said carrier plate carrying said at least one electronic unit and being in heat-conducting contact with said at least one electronic unit.

2. An MR apparatus as claimed in claim 1 wherein said ramp component is selected from the group consisting of a power supply for said basic field magnet, and a ramp down load unit arranged on the MR scanner and including an electrical load that is used for ramping down said basic field magnet.

3. An MR apparatus as claimed in claim 1 wherein said cooling plate is cooled by a coolant that circulates in said cooling device.

4. An MR apparatus as claimed in claim 1 wherein said carrier plate is larger than said cooling plate.

5. An MR apparatus as claimed in claim 1 wherein said carrier plate is mounted on said MR scanner.

6. An MR apparatus as claimed in claim 1 wherein said cooling plate carries said carrier plate mounted thereon.

7. An MR apparatus as claimed in claim 1 wherein at least one of said ramp component and said carrier plate is mounted at an end face of said MR scanner.

8. An MR apparatus as claimed in claim 1 wherein said carrier plate comprises at least one heat-conducting structure selected from the group consisting of a change in thickness of said carrier plate and at least one cooling rib.

9. An MR apparatus as claimed in claim 8 wherein said at least one heat-conducting structure defines a heat-conducting path from said at least one electronic unit to said cooling pate.

10. An MR apparatus as claimed in claim 9 comprising a plurality of electronic units having respective heat-conducting paths therefrom to said cooling plate, and wherein at least some of said heat-conducting paths have respectively different heat conductivity matched to a cooling demand of the respective electronic unit associated therewith.

11. An MR apparatus as claimed in claim 1 wherein said at least one electronic unit is selected from the group consisting of a radio-frequency (RF) transmitter, an RF receiver, a sequence controller, and a power supply.

12. An MR apparatus as claimed in claim 1 comprising a cooling control unit that controls the cooling device so as to provide a higher cooling capacity to said cooling plate during ramping down or ramping up of said basic field magnet.

13. A method for manufacturing a magnetic resonance (MR) apparatus comprising:
   at a first location in a production process, attaching a ramp component to an MR scanner, said ramp component being configured to emit heat during a ramping up or ramping down procedure of a basic field magnet of the MR scanner; and
   at a second location in said production process, attaching a cooling plate in heat-conducting contact with said ramp component, attaching a carrier plate in heat-conducting contact with said cooling plate, and attaching at least one electronic unit in heat-conducting contact to said carrier plate.

14. A method as claimed in claim 13 comprising, at said second location of said production process, first attaching said at least one electronic in heat-conducting contact to said carrier plate, thereby forming a prefabricated unit.

* * * * *